United States Patent
Chiang

(10) Patent No.: US 6,381,144 B1
(45) Date of Patent: Apr. 30, 2002

(54) ASSEMBLY OF COMMUNICATION CARD IN NAME CARD STYLE

(76) Inventor: Shu-Hua Chiang, 10F, No. 8, Da-Yung 3rd St., Chungli City Taoyuan Hsien (TW)

( * ) Notice: Subject to any disclaimer, the term of this patent is extended or adjusted under 35 U.S.C. 154(b) by 0 days.

(21) Appl. No.: 09/984,590

(22) Filed: Oct. 30, 2001

(51) Int. Cl.[7] .................................................. H05K 1/14
(52) U.S. Cl. ........................ 361/737; 361/736; 361/737; 361/752; 361/759; 235/492; 220/4.02; 439/945; 439/946
(58) Field of Search ................................. 361/736, 737, 361/752, 759; 235/492; 220/4.02; 439/945, 946

(56) References Cited

U.S. PATENT DOCUMENTS 5,923,026 A * 7/1999 Onoda ......................... 235/492
6,075,706 A * 6/2000 Learmonth et al. ......... 361/737
6,181,564 B1 * 1/2001 Furusho ....................... 361/737
6,195,054 B1 * 2/2001 Washino et al. ............. 343/702

* cited by examiner

Primary Examiner—David Martin
Assistant Examiner—Thanh S. Phan
(74) Attorney, Agent, or Firm—Bacon & Thomas, PLLC

(57) ABSTRACT

An assembly of communication card in name card style has an upper and a lower metallic lid extended from its two opposite sides downward to form a plurality of protuberant teeth having respective rectangular choke holes. The protuberant teeth are put into through holes in cantilevers on side of a fixing base. A check bar provided with a plurality of choke teeth having jutting hooks and recessed snap portions penetrates through lateral holes in the cantilevers horizontally for being fastened, then the check bar is pushed forward to retain those metallic lids on the fixing base. On the contrary, a user is suggested to push the check bar backward then use a simple tool to dismount the communication card structure.

5 Claims, 6 Drawing Sheets

ASSEMBLY OF COMMUNICATION CARD IN NAME CARD STYLE

FIELD OF THE INVENTION

This invention relates to an assembly of communication card in name card style for simplifying mounting or dismounting job and preventing leakage of electromagnetic waves.

BACKGROUND OF THE INVENTION

A conventional communication card in name card style is usually applied in a wireless notebook computer or PDA (Personal Digital Assistant) for communication communication, to which metallic lids are provided to protect an inside circuit board of the communication card against any external impact and prevent leakage of electromagnetic waves.

As indicated in FIG. 1, the conventional communication card in name card style comprises an upper and a lower metallic lid 1, a circuit board 2, and a fixing base 3. The metallic lid 1 is a rectangular board 11 having its two sides extended downward to form respective fastening plates 12'. The circuit board 2 is locked onto the fixing base 3 whose contour looks like an approximate rectangle having two sides extended to form respective cantilevers 30'.

When assembling the communication card, after the circuit board 2 is fixed on the fixing base 3, the upper and the lower lids 1 is fastened to each other by snapping the fastening plates 12'at the cantilevers 30', then spotted, bound, or solder-jointed. Therefore, in the case of maintenance or replacement of the circuit board 2, the metallic lids 1 will be inevitably spoiled, or the fixing base 3 or the communication card could probably be damaged the worst. In short, after maintenance or test, the metallic lids 1 would be beyond recovery so that a gap or gaps may be thus incurred between the fastening plates 12' and the fixing base 3.

SUMMARY OF THE INVENTION

In order to eliminate abovesaid defect, the primary object of this invention is to provide a communication card in name card style, comprising an upper and a lower metallic lid, a circuit board, and a fixing base with a left and a right check bar.

The metallic lid is substantially a rectangular board having its two opposite sides extended downward to form a plurality of rectangular protuberant teeth respectively. Each protuberant tooth has an inside approximate rectangular choke hole, and each pair of neighboring choke holes is separated by a gap.

The profile of the fixing base is an approximate rectangle, of which two opposite sides are extended to form respective cantilevers. Each cantilever has an open channel and a lateral groove penetrating an upper surface to reach a lower surface of the cantilever or penetrating a lateral surface horizontally to reach the open channel respectively.

The check bar is longitudinally shaped and provided with a plurality of choke teeth aligned at one side. Each choke tooth has a jutting hook at their respective lower ends oriented in a same direction. A recessed snap portion of each jutting hook is arranged in a same direction.

The width and the height of the through hole are designed to mate with the protuberant tooth, and the thickness and the location of the segregation plate are designed to mate with the width of the gap, and the location and the measurements of the lateral hole are arranged to mate with the choke hole.

When assembling the communication card in name card style of this invention, the procedure is to: fix the circuit board firstly on the fixing base; plug the protuberant teeth of the upper and the lower metallic lid in the through holes of the fixing base; set the choke teeth of the left and the right check bar in the choke holes of the protuberant teeth by penetrating through the lateral holes in sequence; push the check bar along direction of the jutting hooks through the recess portion to combine the metallic lids with the fixing base. After combination of the metallic lids to the fixing base is made with the check bar, the width of the check bar is thoroughly stuck in the lateral groove of the fixing base to have the check bar and the cantilever of the fixing base flush and tight to prevent the communication card from leaking electromagnetic waves. Now, the jutting pointer at the lower end of the jutting hook in the choke tooth would snap to fasten the protuberance in the through hole to keep the check bar stuck.

If separation of the metallic lids from the fixing base is desired, a user may use a tool to prop against the recess portion of the check bar, then push the check bar in reverse direction and extract it to dismount the metallic lids and draw the communication card out for test, maintenance, or replacement.

For more detailed information regarding advantages or features of this invention, at least an example of preferred embodiment will be elucidated below with reference to the annexed drawings.

BRIEF DESCRIPTION OF THE DRAWINGS

The related drawings in connection with the detailed description of this invention to be made later are described briefly as follows, in which.

DETAILED DESCRIPTION OF THE INVENTION

Figure 1:
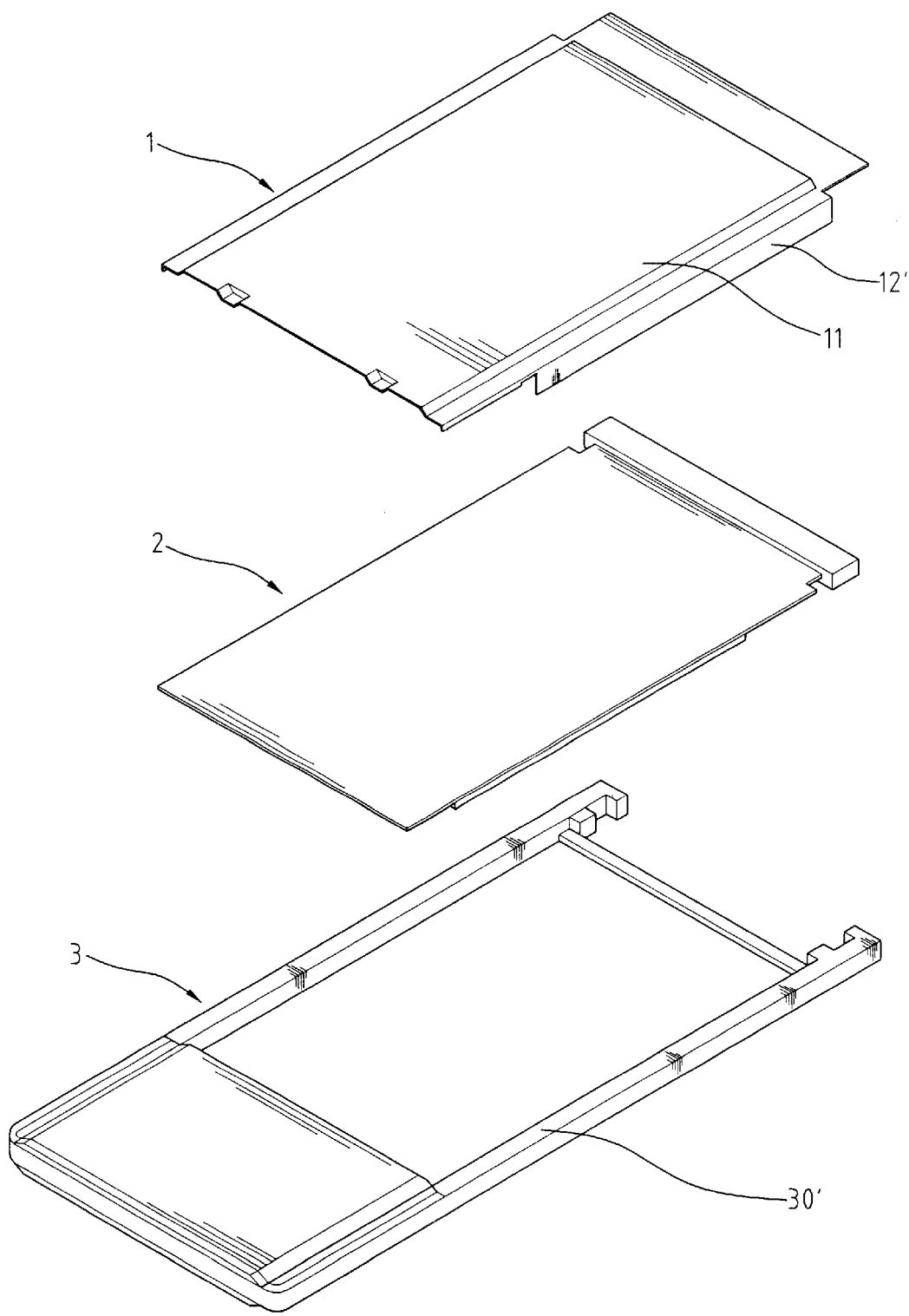
FIG. 1 is an exploded view in three dimensions of a conventional communication card in name card style.
Figure 2:
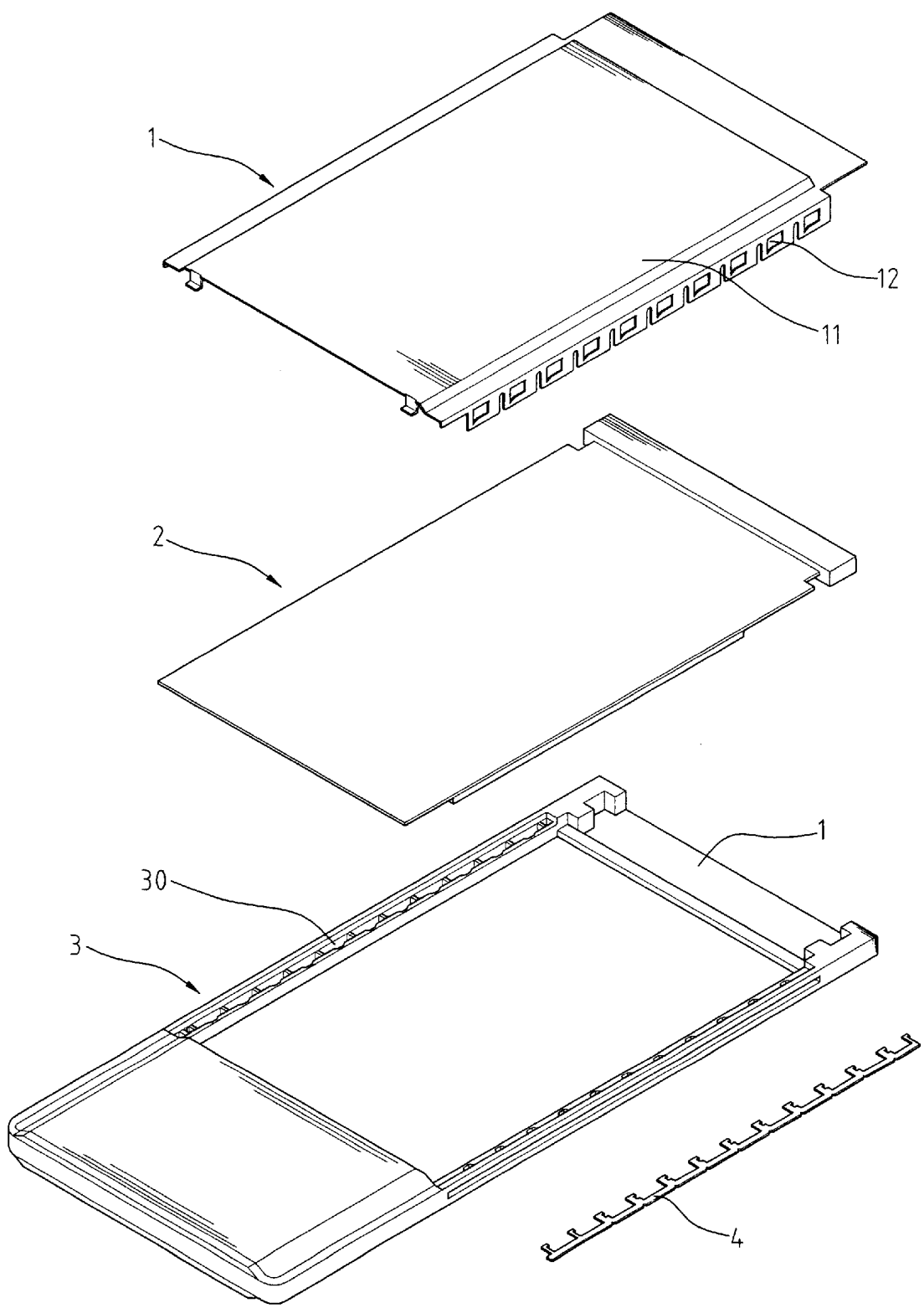
FIG. 2 is an exploded view in three dimensions of a communication card in name card style of this invention.
Figure 3:
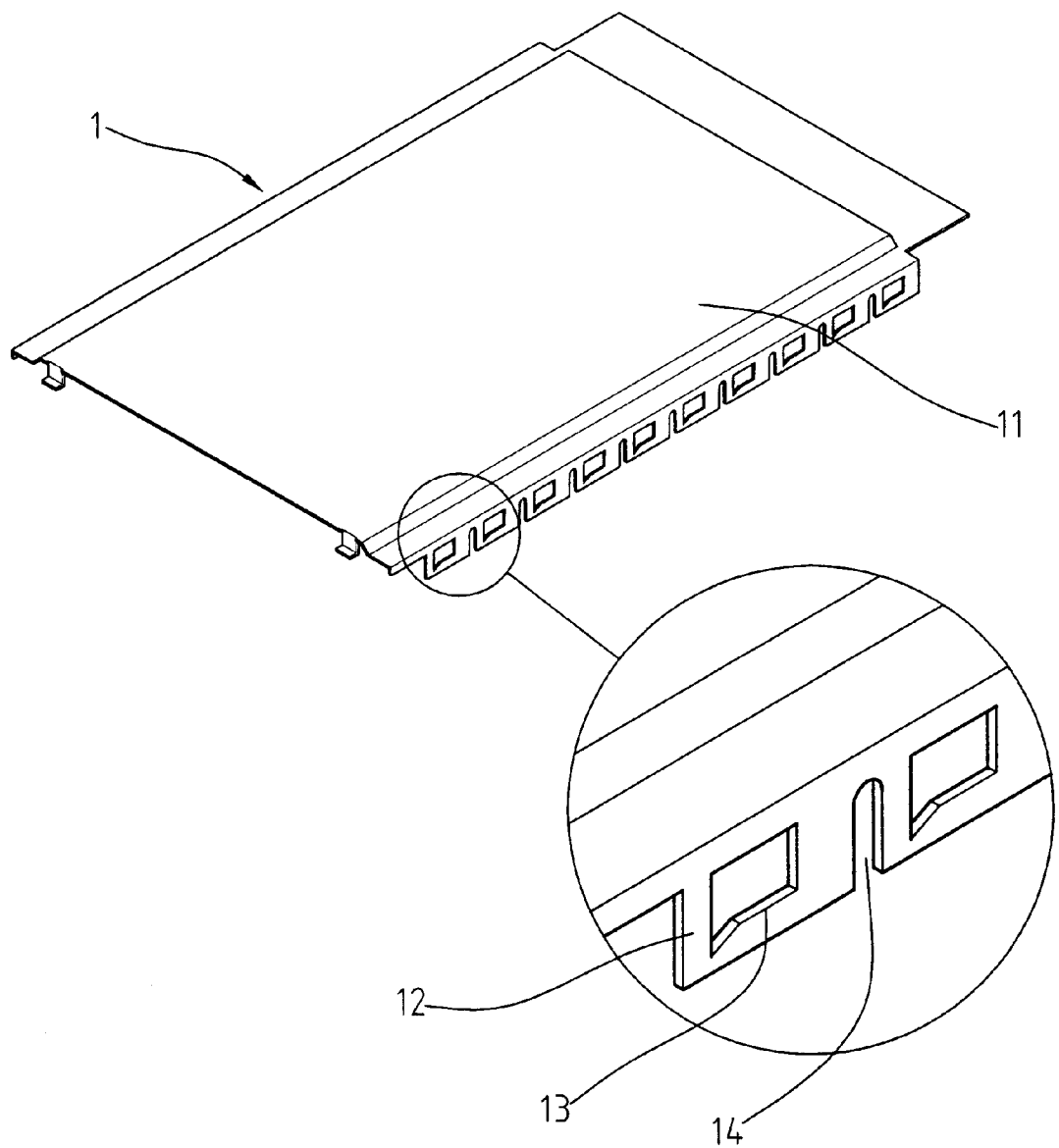
FIG. 3 includes a three-dimensional view and a partly enlarged view of a metallic lid of this invention.
Figure 4:
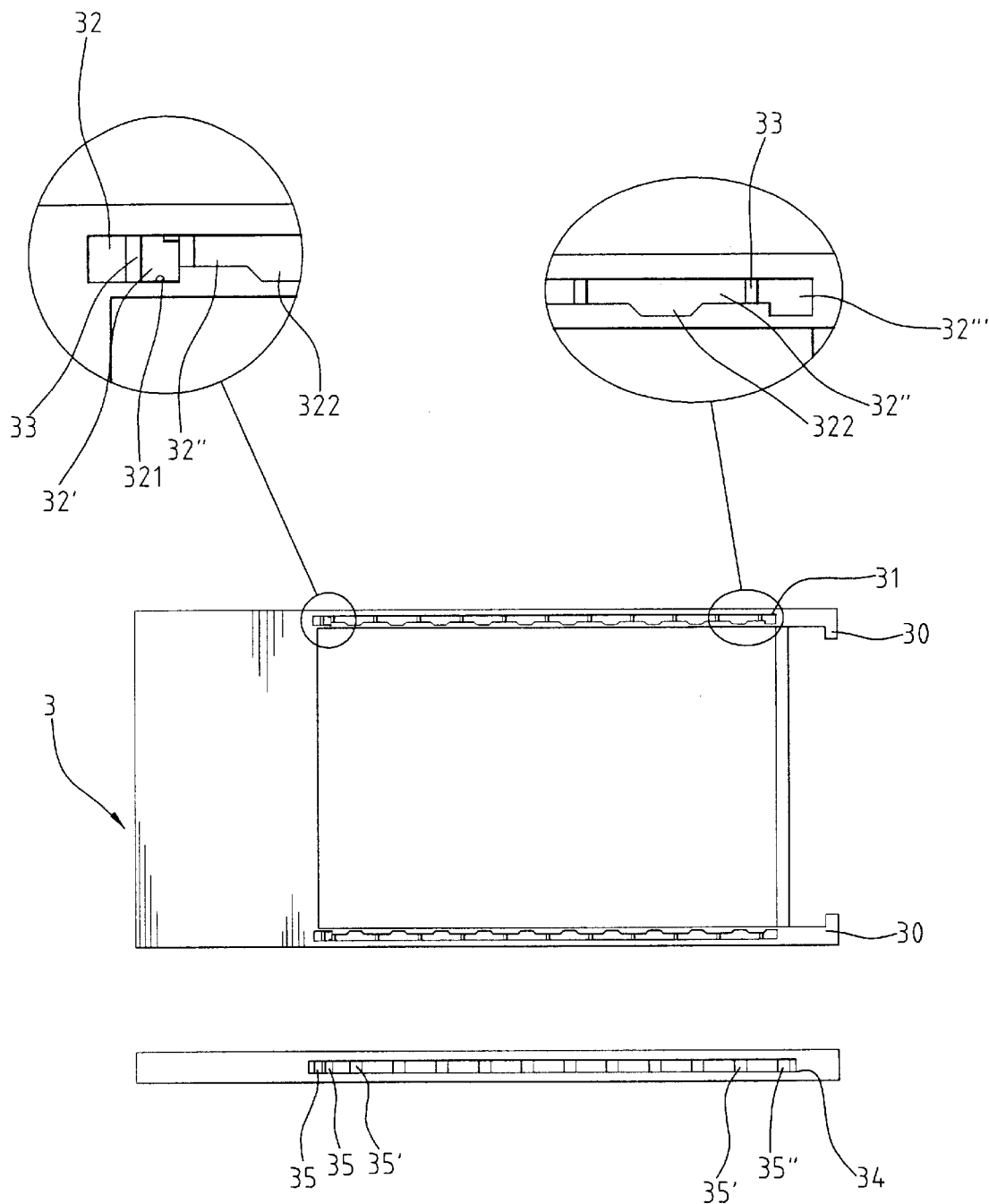
FIG. 4 includes a two-dimensional view and partly enlarged views of a fixing base of this invention.
Figure 5:
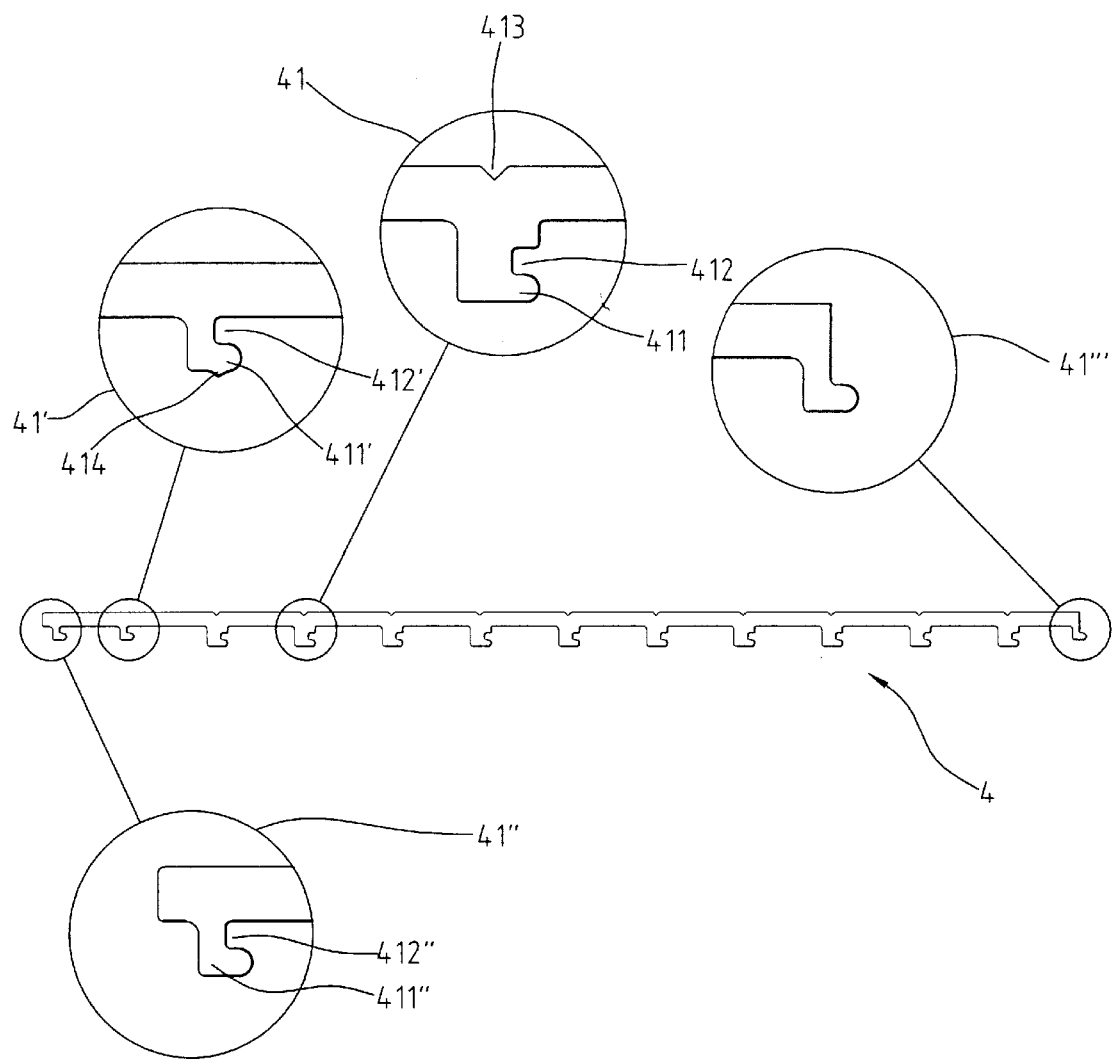
FIG. 5 includes a two-dimensional view and partly enlarged views of a check bar of this invention.

As illustrated in FIG. 2 through FIG. 6, in a preferred embodiment of this invention, an assembly of communication card in name card style mainly comprises an upper and a lower metallic lid 1, a circuit board 2, and a fixing base 3 with a left and a right check bar 4.

The metallic lid 1 is substantially a rectangular board 11 having its two opposite sides extended downward to form a plurality of rectangular protuberant teeth 12 respectively. Each protuberant tooth 12 has an inside approximate rectangular choke hole 13, and every pair of neighboring choke holes 13 is separated by a gap 14.

The circuit board 2 is disposed in an inner space enclosed by the fixing base 3. The profile of the fixing base 3 is an approximate rectangle, of which two opposite sides are extended to form respective cantilevers 30. Each cantilever 30 has an open channel 31 and a lateral groove 34 penetrating an upper surface to reach a lower surface of the cantilever or penetrating a lateral surface horizontally to reach the open channel 31 respectively. The open channel 31 is provided with a plurality of through holes 32, 32', 32'', and 32'''. The through hole 32 has a rectangular cutaway section and the through hole 32' has an approximate rectangular cutaway section and a protuberance 321 adjacent to an inner side of the cantilever 30. The through hole 32" has an approximate rectangular cutaway section and a recess 322 adjacent to an inner side of the cantilever 30. The through hole 32'" also has a rectangular cutaway section, and a thin segregation plate 33 is interposed between any two neighboring through holes. The lateral groove 34 has a plurality of lateral holes 35, 35', and 35".

The check bar 4 is longitudinally shaped and provided with a plurality of choke teeth 41, 41', 41", 41'" aligned at one side. Each choke tooth 41, 41', 41" has a jutting hook 411, 411', 411" at their respective lower ends oriented in a same direction. A recessed snap portion 412, 412', 412" of each jutting hook 411, 411', 411" is arranged in a same direction. Another jutting hook 411'" is formed at a lower end of the choke tooth 41'". Moreover, a recess portion 413 is formed at a proper position of each choke tooth 41 of the check bar 4, and a jutting pointer 414 is disposed beneath the front end of the jutting hook 411' of the choke tooth 41".

In the foregoing metallic lid 1 and the cantilever 30 of the fixing base 3, the width and the height of the through hole 32" are designed to mate with the protuberant tooth 12, and the thickness and the location of the segregation plate 33 are designed to mate with the width of the gap 14, and the location and the measurements of the lateral hole 35' are arranged to mate with the choke hole 13.

In the foregoing metallic lid 1 and the check bar 4, the location and the measurements of the choke tooth 41 are correspondent to the choke hole 13 and the location and the measurements of the snap portion 412 are designed to mate with the location and the thickness of the protuberant tooth 12.

Figure 6:
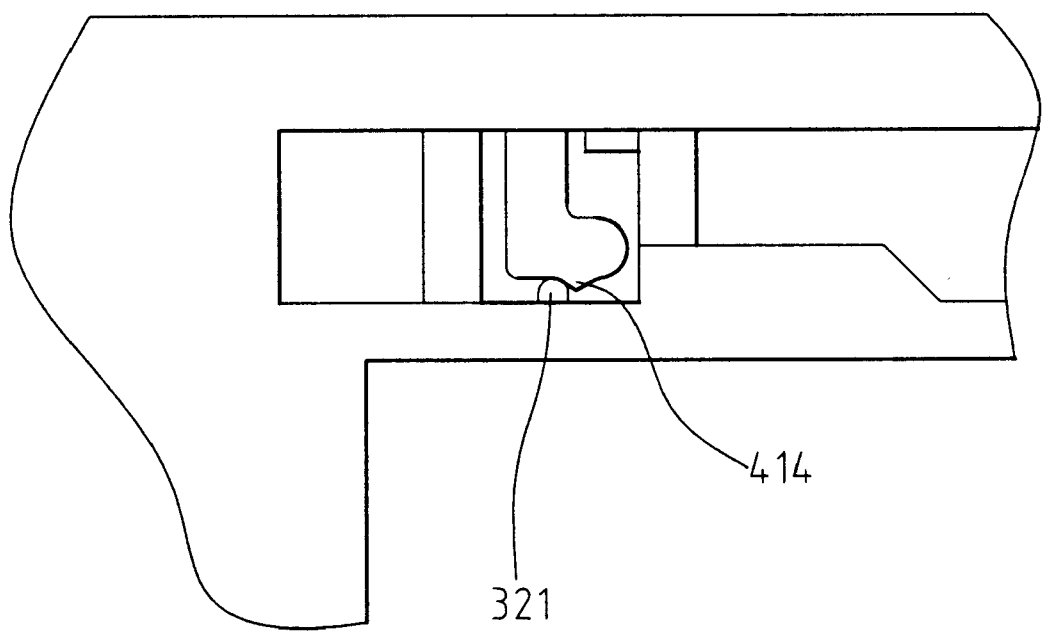
FIG. 6 is an enlarged lateral view of the check bar retained in the fixing base.

In the cantilever 30 of mentioned fixing base 3 and the check bar 4, the location and measurements of the choke tooth 41', 41", 41'" are correspondent to the through hole 32' and the lateral hole 35", the jutting pointer 414 of the choke tooth 41' is arranged to mate with the protuberance 321 of the through hole 32' for fixing the check bar 4 to avoid it getting loosed or slipped out (as shown in FIG. 6). Besides, the location and the measurements of the snap portion 412', 412" of the choke tooth 41', 41'" are designed to mate with the location and thickness of the protuberant tooth 12.

When assembling the communication card in name card style of this invention, the procedure is to: fix the circuit board 2 firstly on the fixing base 3; plug the protuberant teeth 12 of the upper and the lower metallic lid in the through holes 32" of the fixing base 3; set the choke teeth 41, 41', 41", 41'" of the left and the right check bar 4 in the choke holes 13 of the protuberant teeth 12 by penetrating through the lateral holes 35, 35', 35" in sequence; push the check bar 4 along direction of the jutting hooks 411, 411', and 411" through the recess portion 413 to combine the metallic lids 1 with the fixing base 3. After combination of the metallic lids 1 to the fixing base 3 is made with the check bar 4, the width of the check bar 4 is thoroughly stuck in the lateral groove 34 of the fixing base 3 to have the check bar 4 and the cantilever 30 of the fixing base 3 flush and tight to prevent the communication card from leaking electromagnetic waves. Now, the jutting pointer 414 at the lower end of the jutting hook 411' in the choke tooth 41' would snap to-fasten the protuberance 321 in the through hole 32' to keep the check bar 4 stuck.

If separation of the metallic lids 1 from the fixing base 3 is desired, a user may use a tool to prop against the recess portion 413 of the check bar 4, then push the check bar 4 in reverse direction and extract it to dismount the metallic lids 1 and draw the communication card out for test, maintenance, or replacement.

In the above described, at least one preferred embodiment has been described in detail with reference to the drawings annexed, and it is apparent that numerous variations or modifications may be made without departing from the true spirit and scope thereof, as set forth in the claims below.

What is claimed is:

1. An assembly of communication card in name card style, comprising an upper and a lower metallic lid, a circuit board, and a fixing base with a left and a right check bar, wherein the metallic lid is substantially a rectangular board having its two opposite sides extended downward to form a plurality of protuberant teeth respectively, each protuberant tooth has an inside approximate rectangular choke hole, and each pair of neighboring choke holes is separated by a gap;

the fixing base is an approximate rectangle, in which two opposite sides are extended to form respective cantilevers, each cantilever has an open channel and a lateral groove penetrating an upper surface to reach a lower surface of the cantilever or penetrating a lateral surface horizontally to reach the open channel respectively, wherein the open channel is provided with a plurality of through holes and the lateral groove with a plurality of lateral holes; and a thin segregation plate is interposed between any two neighboring through holes;

the check bar is longitudinally shaped and provided with a plurality of choke teeth aligned at one side, wherein each choke tooth has a jutting hook at their respective lower ends oriented in a same direction, and a recessed snap portion of each jutting hook is arranged in a same direction; and the location and measurements of the choke tooth are correspondent to the through hole, the lateral hole and the jutting pointer of the choke tooth are arranged to mate with the protuberance of the through hole, and the location and the measurements of the snap portion of the choke tooth are designed to mate with the location and thickness of the protuberant tooth.

2. The communication card according to claim 1, wherein at least an extra through hole shaped in an approximate rectangle is formed in the open channel of respective cantilevers on sides of the fixing base, and an extra lateral hole and a correspondent choke tooth are provided to the lateral groove or the check bar respectively, wherein a snap portion of the added choke tooth is located between the added lateral hole of the lateral groove and the open channel with measurements approximately equal to the thickness defined by the lateral hole and the open channel.

3. The communication card according to claim 2, wherein the cutaway section of the added through hole has a protuberance adjacent to inner side of the cantilever, while a jutting pointer is provided to a jutting hook at the lower end of the added choke tooth in order to mate with the added protuberance of the through hole such that the check bar is pushed forward to lock the metallic lids onto the fixing base.

4. The communication card according to claim 1, wherein a recess adjacent to the inner side of the cantilever is provided to the plurality of through holes to mate with the choke tooth both in location and measurements.

5. The communication card according to claim 1, wherein a properly dented recess portion is formed at a position where the check bar is correspondent to the plurality of choke teeth.

\* \* \* \* \*